(12) United States Patent
Seddon

(10) Patent No.: US 11,942,366 B2
(45) Date of Patent: Mar. 26, 2024

(54) BACKSIDE METAL PATTERNING DIE SINGULATION SYSTEMS AND RELATED METHODS

(71) Applicant: SEMICONDUCTOR COMPONENTS INDUSTRIES, LLC, Phoenix, AZ (US)

(72) Inventor: Michael J. Seddon, Gilbert, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

(21) Appl. No.: 17/937,499

(22) Filed: Oct. 3, 2022

(65) Prior Publication Data
US 2023/0028096 A1 Jan. 26, 2023

Related U.S. Application Data

(63) Continuation of application No. 17/082,579, filed on Oct. 28, 2020, now Pat. No. 11,495,493, which is a continuation of application No. 16/505,902, filed on Jul. 9, 2019, now Pat. No. 10,825,725.

(60) Provisional application No. 62/796,668, filed on Jan. 25, 2019.

(51) Int. Cl.
*H01L 21/78* (2006.01)
*H01L 21/3213* (2006.01)
*H01L 21/768* (2006.01)

(52) U.S. Cl.
CPC .. *H01L 21/76871* (2013.01); *H01L 21/32136* (2013.01); *H01L 21/32139* (2013.01); *H01L 21/78* (2013.01)

(58) Field of Classification Search
None
See application file for complete search history.

(56) References Cited

U.S. PATENT DOCUMENTS

| 10,825,725 | B2 * | 11/2020 | Seddon | H01L 21/78 |
| 11,495,493 | B2 * | 11/2022 | Seddon | H01L 21/32136 |
| 2010/0028633 | A1 | 2/2010 | O'Rourke et al. | |
| 2010/0120227 | A1 | 5/2010 | Grivna et al. | |
| 2019/0267344 | A1 | 8/2019 | Seddon et al. | |

OTHER PUBLICATIONS

Van Zant, Peter "Micorchip fabrication: a practical guide to semiconductor processing" 2000 McGraw Hill 4th ed p. 263.

* cited by examiner

*Primary Examiner* — Bradley Smith
(74) *Attorney, Agent, or Firm* — Adam R. Stephenson, LTD.

(57) ABSTRACT

Implementations of die singulation systems and related methods may include forming a plurality of die on a first side of a substrate, forming a seed layer on a second side of a substrate opposite the first side of the substrate, using a shadow mask, applying a mask layer over the seed layer, forming a backside metal layer over the seed layer, removing the mask layer, and singulating the plurality of die included in the substrate through removing substrate material in the die street and through removing seed layer material in the die street.

18 Claims, 4 Drawing Sheets

BACKSIDE METAL PATTERNING DIE SINGULATION SYSTEMS AND RELATED METHODS

CROSS REFERENCE TO RELATED APPLICATIONS

This application is a continuation of the earlier U.S. patent application Ser. No. 17/082,579, entitled "Backside Metal Patterning Die Singulation Systems and Related Methods" to Seddon, filed Oct. 28, 2020, now pending, which application is a continuation of the earlier U.S. patent application Ser. No. 16/505,902, entitled "Backside Metal Patterning Die Singulation Systems and Related Methods" to Seddon, filed Jul. 9, 2019, now issued as U.S. Pat. No. 10,825,725, which application claimed the benefit of the filing date of U.S. Provisional Patent Application 62/796,668, entitled "BACKSIDE METAL PATTERNING DIE SINGULATION SYSTEMS AND RELATED METHODS" to Seddon, which was filed on Jan. 25, 2019, the disclosures of each of which are hereby incorporated entirely herein by reference.

BACKGROUND

1. Technical Field

Aspects of this document relate generally to die singulation systems and methods. More specific implementations involve methods of singulating semiconductor die from a thinned substrate.

2. Background

Semiconductor devices include integrated circuits found in common electrical and electronic devices, such as phones, desktops, tablets, other computing devices, and other electronic devices. The devices are separated through singulating a wafer of semiconducting material into a plurality of semiconductor die. Various layers may be coupled to the front side and/or the backside of the wafer. Upon singulation, the die can be mounted on a package and electrically integrated with the package which may then be used in the electrical or electronic device.

SUMMARY

Implementations of die singulation systems and related methods may include forming a plurality of die on a first side of a substrate, forming a seed layer on a second side of a substrate opposite the first side of the substrate, using a shadow mask, applying a mask layer over the seed layer, forming a backside metal layer over the seed layer, removing the mask layer, and singulating the plurality of die included in the substrate through removing substrate material in the die street and through removing seed layer material in the die street.

Implementations of die singulation systems and related methods may include one, all, or any of the following:

The mask layer may include a polymer material.
The mask layer may include a photoresist material.
The seed layer may include titanium.
The backside metal layer may include copper.
Removing substrate material in the die street may include plasma etching.
Removing substrate material in the die street and removing seed layer material in the die street may include using either a laser beam or a saw blade.

The method may include thinning the second side of the substrate to a thickness less than 30 micrometers.
The method may include aligning the substrate from a backside of the substrate.

Implementations of die singulation systems and related methods may include forming a plurality of die on a first side of a substrate, forming a seed layer on a second side of a substrate opposite the first side of the substrate, using a shadow mask, applying a mask layer over the seed layer, removing the shadow mask, forming a backside metal layer over the seed layer, removing the mask layer, and singulating the plurality of die included in the substrate through removing substrate material in the die street and through removing seed layer material in the die street using either a laser beam or a saw blade.

Implementations of die singulation systems and related methods may include one, all, or any of the following:

The mask layer may include a resin material.
The mask layer may include a photoresist material.
The method may include remote plasma healing a sidewall of the die street.
The method may include thinning the second side of the substrate to a thickness less than 30 micrometers.
The method may include aligning the substrate from a backside of the substrate.

Implementations of die singulation systems and related methods may include forming a plurality of die on a first side of a substrate, forming a seed layer on a second side of a substrate opposite the first side of the substrate, and using a shadow mask corresponding to die streets of the substrate, forming a mask layer over the die streets of the substrate. The method may also include forming a backside metal layer over the seed layer between the mask layer, removing the mask layer from the die streets, and singulating the plurality of die included in the substrate through removing substrate material in the die street and through removing seed layer material in the die street using either a laser beam or a saw blade.

Implementations of die singulation systems and related methods may include one, all, or any of the following:

The mask layer may include a photoresist material.
The method may include remote plasma healing a sidewall of the die.
The backside metal layer may be 10 micrometers thick.
The mask layer may include a resin.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended die singulation systems and methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such die singulation systems and methods, and implementing components and methods, consistent with the intended operation and methods.

Figure 1:
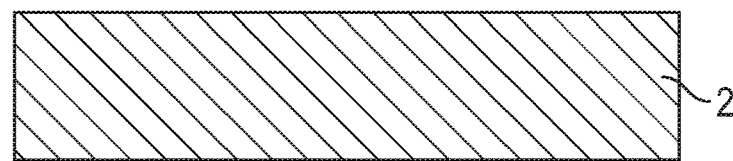
FIG. 1 is a cross sectional side view of a portion of a substrate.

Referring to FIG. 1, a cross sectional side view of a portion of a substrate 2 is illustrated. The term "substrate" refers to a semiconductor substrate as a semiconductor substrate is a common type of substrate, however, "substrate" is not an exclusive term that is used to refer to all semiconductor substrate types. Similarly, the term "substrate," may refer to a wafer as a wafer is a common type of substrate, however, "substrate" is not an exclusive term that is used to refer to all wafers. The various semiconductor substrate types disclosed in this document that may be utilized in various implementations may be, by non-limiting example, round, rounded, square, rectangular, or any other closed shape. In various implementations, the substrate 2 may include a substrate material such as, by non-limiting example, single crystal silicon, silicon dioxide, glass, gallium arsenide, sapphire, ruby, silicon-on-insulator, silicon carbide, polycrystalline or amorphous forms of any of the foregoing, and any other substrate material useful for constructing semiconductor devices. In particular implementations, the substrate may be a silicon-on-insulator substrate.

Figure 2:
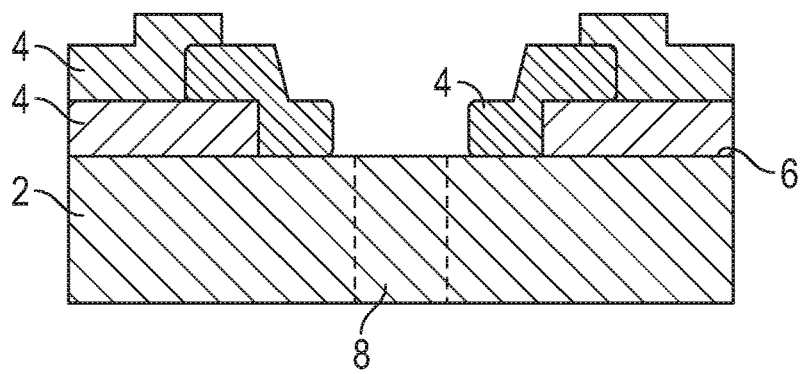
FIG. 2 is a cross sectional side view of a plurality of layers coupled to a first side of the substrate of FIG. 1.

Referring to FIG. 2, a cross sectional side view of a plurality of layers coupled to a first side of the substrate of FIG. 1 is illustrated. In various implementations, before singulating a plurality of die from the substrate 2, the method of forming a plurality of die may include forming a plurality of die on the substrate. This may include forming a plurality of layers 4 on a first side 6 the substrate 2. As illustrated by FIG. 2, the plurality of layers 4 may be patterned, and in various implementations, may be patterned (or otherwise removed) to not be over a die street 8 in the substrate 2. The plurality of layers may include, by non-limiting example, one or more metal layers, one or more passivation layers, any other layer, and any combination thereof. In various implementations passivation layers may include, by non-limiting example, silicon nitride, oxides, metal electrical test structures, electrical test pads, silicon dioxide, polyimides, metal pads, residual underbump metallization (UBM), any combination thereof, and any other layer or material capable of facilitating electrical or thermal connection between the one or more semiconductor die and/or protecting the one or more semiconductor die from contaminants. In various implementations, the plurality of die may include power semiconductor devices, such as, by non-limiting example, a MOSFET, an IGBT, or any other power semiconductor device. In other implementations, the plurality of die may include non-power semiconductor devices.

Figure 3:
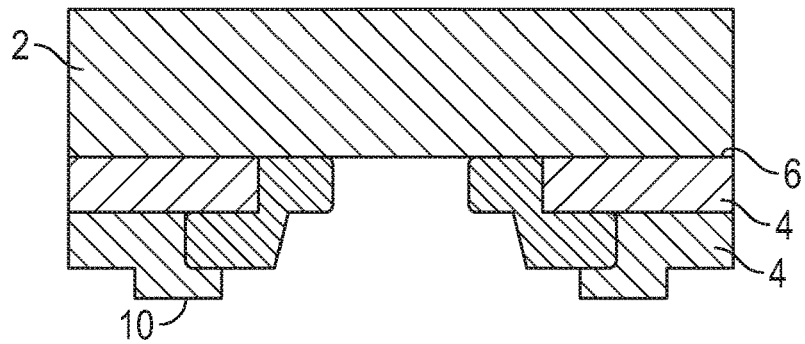
FIG. 3 is a view of the substrate and plurality of layers of FIG. 2 in a flipped orientation.
Figure 4:
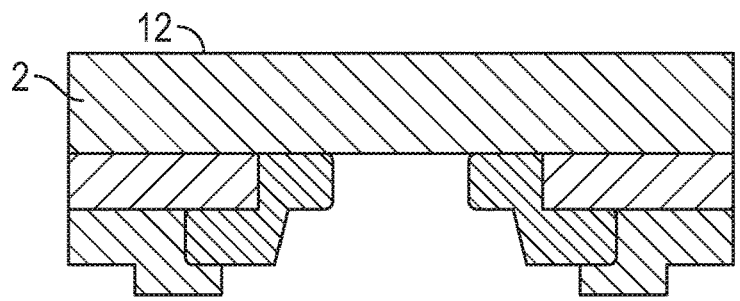
FIG. 4 is a view of the substrate and plurality of layers of FIG. 3 with the substrate thinned.

Referring to FIG. 3, a view of the substrate and plurality of layers of FIG. 2 in a flipped orientation is illustrated. The method of forming and singulating a plurality of die includes flipping the substrate and, though not illustrated, in various implementations, the method may include applying a tape to a first side 10 of the plurality of layers 4. Such a tape may be a backgrind tape in various implementations. Referring to FIG. 4, a view of substrate and plurality of layers of FIG. 3 with the substrate thinned is illustrated. In various implementations, the method of forming and singulating a plurality of die may include thinning the second side 12 of the substrate 2. In various implementations, the substrate 2 may be thinned to a thickness less than 50 micrometers (μm). In other implementations, the substrate 2 may be thinned to a thickness less than 30 μm. In still other implementations, the substrate 2 may be thinned to a thickness less than 100 μm, more than 100 μm, and in other various implementations, the substrate 2 may not be thinned. In particular implementations, the substrate 2 may be thinned to a thickness of about 25 μm, and in other particular implementations, the substrate may be thinned to a thickness of about 75 μm. The substrate 2 may be thinned through backgrinding, etching, or any other thinning technique. In particular implementations, the substrate is thinned using a backgrinding process marketed under the trade name TAIKO by DISCO of Tokyo, Japan to form an edge ring used to support the thinned wafer.

Figure 5:
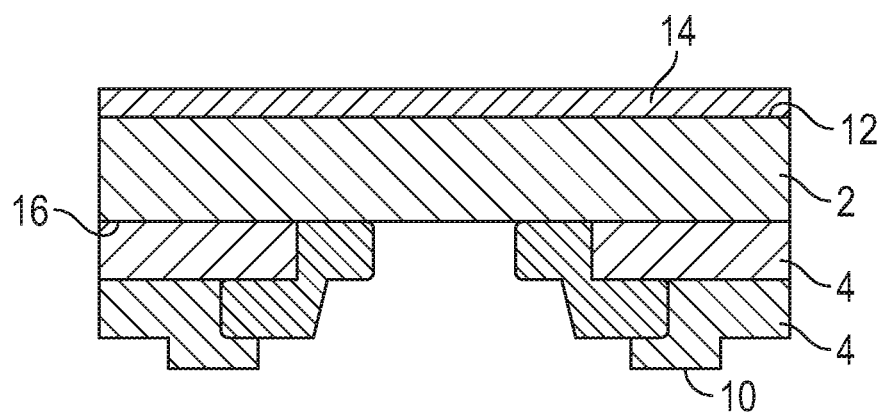
FIG. 5 is a view of the substrate of FIG. 4 with a seed metal layer coupled thereto.

Referring to FIG. 5, a view of the substrate of FIG. 4 with a seed metal layer coupled thereto is illustrated. In various implementations, a method of singulating a plurality of die may include forming a seed layer 14 on a second side 12 of a substrate 2 opposite the first side 16 of the substrate. In particular implementations, the seed layer 14 may be directly coupled to the second side 12 of the substrate 2. The seed layer 14 may be applied to the substrate 2 using, by non-limiting example, evaporating, electroplating, electroless plating, or any another method of metal deposition. In various implementations, the seed layer may entirely coat the second side 12 of the substrate 2. In such implementations, the seed layer may provide electrical continuity throughout the seed layer to facilitate electroplating of a backside metal layer to the seed layer 14 as disclosed later herein. In various implementations, the seed layer 14 may include an adhesion layer which may be directly coupled to the substrate 2. The adhesion layer may include, by non-limiting example, titanium, tungsten, any other metal, any alloys thereof, and any combination thereof. The seed layer 14 may also include a layer over the adhesion layer which may include the same material as the backside metal layer configured to be coupled to the seed layer. In various implementations, the layer of the seed layer 14 over the adhesion layer may include copper, any other metal, any alloy thereof, and any combination thereof. In various implementations, the seed layer may be about 0.3 to about 0.5 μm thick, however, in other implementations the seed layer may be more or less than 1 μm thick.

Figure 6:
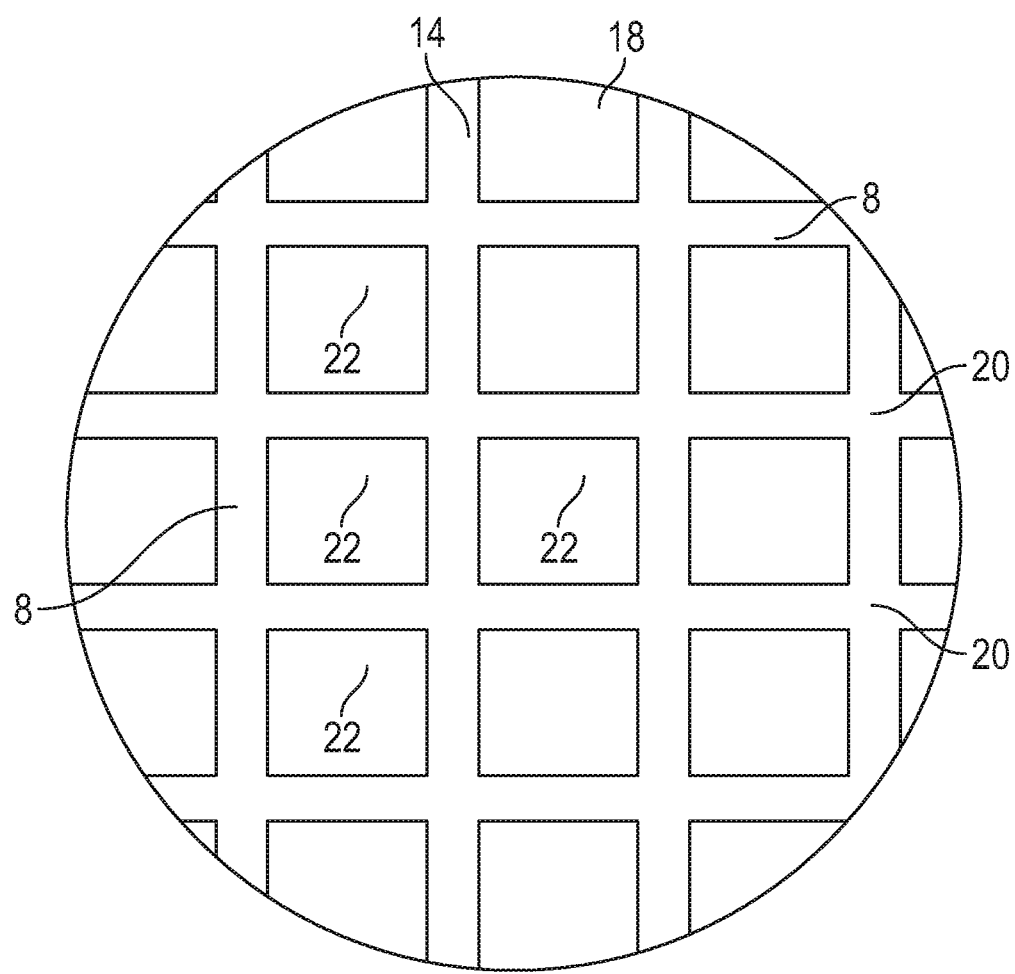
FIG. 6 is a top view of a portion of a substrate having a shadow mask positioned over the substrate.

Referring to FIG. 6, a top view of a portion of a substrate having a shadow mask positioned over the substrate is illustrated. In various implementations, the method of singulating a plurality of die in a substrate includes aligning a shadow mask 18 over the seed layer 14. In various implementations, the openings 20 in the shadow mask 18 may be aligned along the die streets 8 of the substrate 2. In various implementations, the method may include aligning the substrate from the first side (which may be the front side, or bottom side as oriented in FIG. 5) using optics or a camera. In such implementations, the optics or camera may be placed below the substrate 2 and may detect a plurality of alignment features formed on or within the substrate. In various implementations, the alignment features may be formed on or within the die street 8 of the substrate 2. In implementations having tape coupled to the first side 10 of the plurality of layers 4, as illustrated by FIG. 5, the optics or camera may be configured to detect the plurality of alignment features through the tape. In a particular implementation, the substrate may be aligned using an infrared (IR) camera and IR alignment features. In other implementations, the substrate may be aligned from the backside, or second side 12 of the substrate 2. In such implementations, alignment features may be placed on the seed layer 14 covering the substrate 2. Such features may be placed according to corresponding alignment features on the opposing first side of the substrate. In other implementations where the substrate includes a ring around the perimeter after thinning the substrate, the method of aligning the substrate may include placing alignment features in the periphery of the substrate and grinding down the perimeter/edge ring. The substrate 2 may then be aligned from the backside, or second side 12 of the substrate by using the alignment features along the outer edge of the device. Such an alignment method may include using IR spectroscopy. In various implementations, the shadow mask 18 may be aligned by hand or by an alignment device depending on the amount of precision required.

Still referring to FIG. 6, a single shadow mask may be used to pattern the mask layer over the seed layer. In such implementations, though not illustrated, a plurality of ties may be used to tie together the solid portions 22 of the shadow mask. The ties may be small enough to not meaningfully interfere with the optical imaging of the mask layer. In other implementations, though not illustrated, the shadow mask 18 may include an upper plate with supports extending below to each solid portion 22 of the shadow mask. In such an implementation, a sprayer could follow the streets (or openings 20) of the shadow mask above the openings 20 and below the upper plate while applying the mask layer through the openings. In other implementations, rather than a single shadow mask, multiple shadow masks (or the same shadow mask used in multiple orientations) may be used in applying the mask layer on the seed layer. Particular implementations may include applying the mask layer through a plurality of parallel slits of a mask. After applying the mask layer in a first direction, the shadow mask may then be rotated ninety degrees (or more or less than ninety degrees) and the mask layer may be applied over the seed layer in a second direction. Such an implementation may be used when the die singulated are rectangular or have a quadrilateral shape. In a similar implementation, the shadow mask having the plurality of parallel slits may be rotated a second time and the mask layer may be applied a third time or more times depending on the number of edges of the die (as the die may be any polygonal closed shape). Such an implementation may be used when the die singulated are triangular. In various implementations, the shadow mask is positioned above the seed layer without physically contacting the seed layer. In other implementations, the shadow mask may be a single piece of optically transmissive material that can project the shadow of the image of the streets into material deposited on the substrate, causing activation of the material exposed, which may then be removed through a lithographic developing process.

Figure 7:
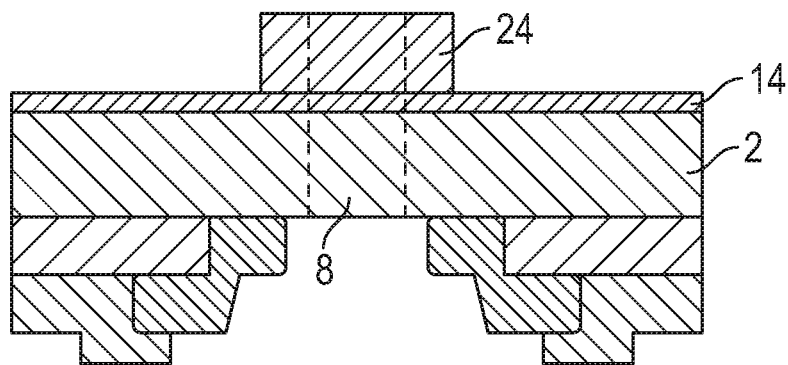
FIG. 7 is a cross-sectional side view of a mask layer formed over the substrate of FIG. 5.

Referring to FIG. 7, a cross-sectional side view of a mask layer formed over the seed layer of FIG. 5 is illustrated. The method of singulating a plurality of die includes applying a mask layer 24 over the seed layer 14 using a shadow mask. The mask layer is applied over the die streets 8. Because the mask layer 24 is applied over the die streets 8 using the shadow mask, the mask layer may correspond to the die streets with a reasonable to high degree of accuracy. In turn, this may allow for accurate deposition of the backside metal layer, as disclosed later herein, and may also allow for more narrow die streets, resulting in more die per substrate. In various implementations, the mask layer may include a polymer or resin. The mask layer may also include a photoresist material, however, because the mask layer may be already patterned without the need to expose or develop the mask layer a photoresist material not need to be used in the mask layer. In implementations where the backside metal layer is electroplated onto the seed layer, as disclosed later herein, the mask layer 24 may include an electrically insulative material. In various implementations, the method of singulating a plurality of die may include spraying the mask layer 24 onto the seed layer 14 through the shadow mask. In other implementations, the method may include forcing the mask layer 24 through the shadow mask and onto the seed layer 14 using a squeegee and a stencil. Upon applying the mask layer 24, the method of singulating a plurality of die may include removing the shadow mask.

Figure 8:
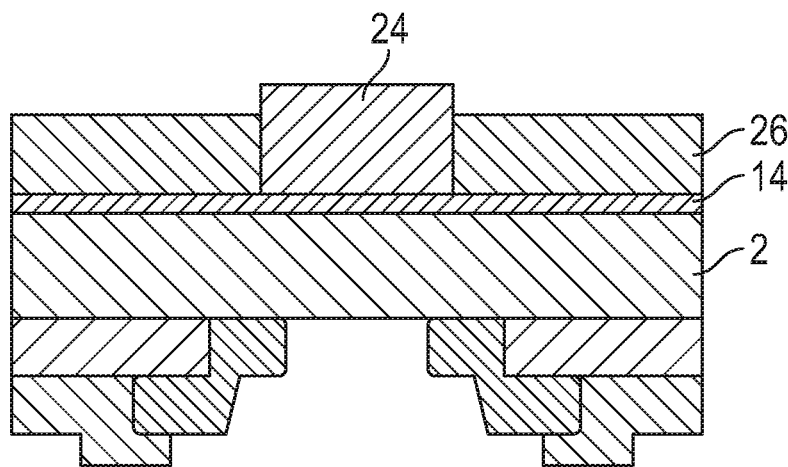
FIG. 8 is a cross-sectional side view of a backside metal layer formed over the seed layer of FIG. 5.

Referring to FIG. 8, a cross-sectional side view of a backside metal layer formed over the seed layer of FIG. 5 is illustrated. In various implementations, the method of singulating a plurality of die includes forming a backside metal layer 26 over the seed layer 14 and between the openings in the mask layer 24. In particular implementations, the method may include electroplating the backside metal layer 26 over the seed layer. The backside metal layer 26 may include copper, a copper alloy, any other metal, or any combination thereof. The backside metal layer 26 may be about 10 μm thick, about 15 μm thick, more than 10 μm thick, or less than 15 μm thick.

Figure 9:
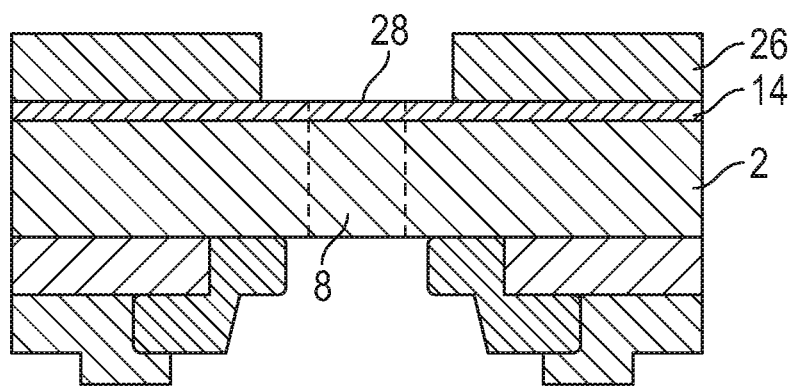
FIG. 9 is a view of the substrate and seed layer of FIG. 8 with the mask layer removed.

Referring to FIG. 9, a view of the substrate and seed layer of FIG. 8 with the mask layer removed is illustrated. The method of singulating a plurality of die included in a substrate includes removing the mask layer 24 covering the die streets 8, as illustrated by FIG. 8. The method may include removing the mask layer 24 through etching, plasma ashing, or solvent stripping. The seed layer 14 may prevent damage to the substrate 2 during removal of the mask layer 24. Upon removing the mask layer 24, the portion 28 of the seed layer 14 in the die street 8 may be exposed.

Figure 10:
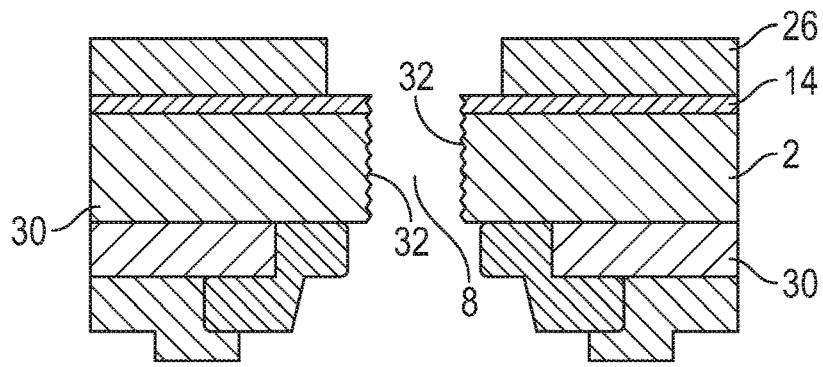
FIG. 10 is a view of the substrate of FIG. 9 singulated into a plurality of die.

Referring to FIG. 10, a view of the substrate of FIG. 9 singulated into a plurality of die is illustrated. The method of singulating a plurality of die 30 in the substrate 2 includes removing substrate material in the die street 8 and removing a seed layer material in the die street. In various implementations, each die of the plurality of die may have a perimeter which is a quadrilateral or a triangular shape (or a closed polygonal shape), depending on the pattern of the mask layer (and in turn, depending on the location of the die street) applied over the seed layer, as previously disclosed herein.

Figure 11:
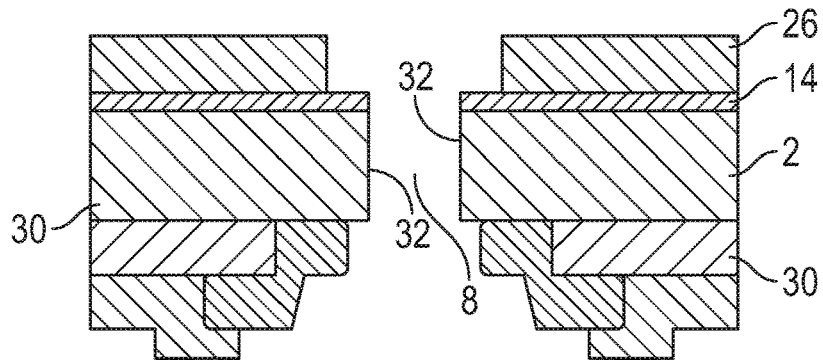
FIG. 11 is a view of the plurality of die of FIG. 10 having smooth sidewalls.

In various implementations, the substrate material in the die street 8 and the seed layer material in the die street may be removed using either a laser beam or a saw blade. In such implementations, the seed layer material in the die street 8 may be simultaneously removed with the substrate material in the die street as the laser ablation or sawing used to clear the seed metal material from the die street may also clear the substrate material from the die street. In implementations using a laser beam or saw blade to singulate the plurality of die 30, the laser beam or saw blade may result in roughened sidewalls 32 of the die street 8 or roughened sidewalls of the plurality of die 30. In such implementations, the method of singulating a plurality of die 30 from the substrate may include remote plasma healing a sidewall of each die (or sidewall 32 of the die street 8) of the plurality of die 30. Referring to FIG. 11 a view of the plurality of die of FIG. 10 having smoothed sidewalls is illustrated. In various implementations, the method of singulating the plurality of die 30 may include removing damage from a sidewall 32 of the die street 8 through remote plasma healing. In such implementations, an isotropic plasma etch may be applied to the sidewalls 30 of the die street 8. The plasma may penetrate/facilitate reaction with the materials of the cracks and/or chips of the sidewalls 32 formed when the plurality of die 30 were singulated from the substrate 2. As the plasma enters the cracks and/or chips, the damaged portion of the substrate 2 may etch away and result in smoothed, or healed, sidewalls 32 of the die street 8, as illustrated by FIG. 11.

In the various implementations disclosed herein, by removing the backside metal layer in the die street, the risk of re-deposition of the backside metal material along the sidewalls of each die of the plurality of die is reduced. Though the seed metal layer may be removed at the same time the substrate material is removed from the die street, and in turn, the plurality of die are singulated, because the seed metal layer is extremely thin as compared to the thickness of the backside metal layer the risk of re-deposition is still reduced. Further, because various implementations disclosed herein include methods of singulating a plurality of die from a second side, or backside of the substrate, there is no need to flip the substrate over in order to singulate the substrate from the first side, or side having the plurality of die formed thereon. The ability to singulate the die from the backside may reduce damage to the substrate, and especially a thinned substrate, as it requires the substrate to be handled less. This may in turn cause the yield from the process to be increased correspondingly.

Figure 12:
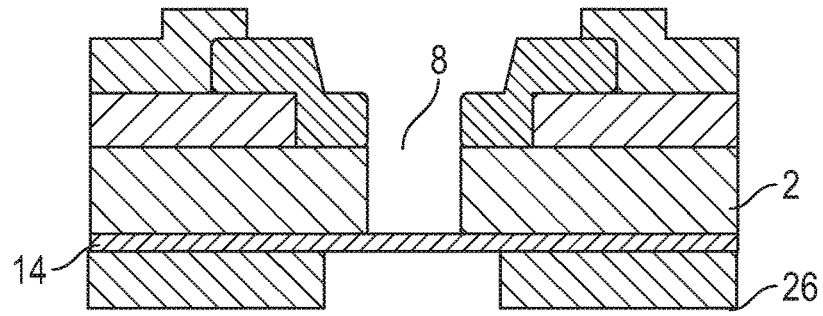
FIG. 12 is a view of the substrate of FIG. 9 in a flipped orientation and with substrate material in the die street removed.
Figure 13:
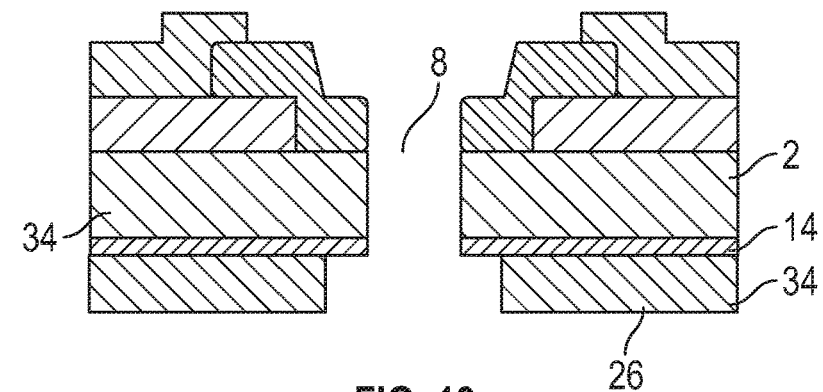
FIG. 13 is a view of the substrate of FIG. 12 singulated into a plurality of die.

Referring to FIG. 12, a view of the substrate of FIG. 9 in a flipped orientation and with substrate material in the die street removed is illustrated. In another implementation, rather than singulating the plurality of die as illustrated by FIG. 10, the method of singulating a plurality of die may include flipping the substrate 180 degrees and removing the substrate material in the die street 8. In various implementations, the substrate material may be removed through plasma etching. In various implementations, a plasma etch process marketed under the tradename BOSCH® by Robert Bosch GmbH, Stuttgart Germany (the "Bosch process"), may be used to remove the substrate material in the die street 8. In other implementations, other plasma etch processes may be used to remove the substrate material in the die street 8. In such implementations, because plasma etching can remove a narrow amount of substrate material, the width of the substrate material removed may be less than a width of the die street. In other implementations, the width of the substrate material removed may be the same as the width of the die street. Referring to FIG. 13, a view of the substrate of FIG. 12 singulated into a plurality of die is illustrated. In various implementations, the method of singulating a plurality of die 34 may include jet ablating the seed metal material in the die street 8. In the implementation illustrated by FIGS. 12-13, by removing the backside metal layer in the die street and by removing the substrate material in the die street through plasma etching prior to removing the seed layer material in the die street 8, the risk of re-deposition of the backside metal material along the sidewalls of each die of the plurality of die may be removed.

In places where the description above refers to particular implementations of die singulation systems and methods and implementing components, sub-components, methods and sub-methods, it should be readily apparent that a number of modifications may be made without departing from the spirit thereof and that these implementations, implementing components, sub-components, methods and sub-methods may be applied to other die singulation systems and methods.

What is claimed is:

1. A method of singulating a plurality of die comprised in a substrate, the method comprising:
    forming a plurality of die on a first side of a substrate;
    using a shadow mask, applying a mask layer over a second side of the substrate;
    forming a backside metal layer over the second side of the substrate;
    removing the mask layer;
    flipping the substrate; and
    singulating the plurality of die comprised in the substrate through removing substrate material in a die street from the first side of the substrate.

2. The method of claim 1, wherein the mask layer comprises a polymer material.

3. The method of claim 1, wherein the mask layer comprises a photoresist material.

4. The method of claim 1, wherein the backside metal layer comprises copper.

5. The method of claim 1, wherein removing substrate material in the die street further comprises plasma etching.

6. The method of claim 1, further comprising forming a seed layer over the second side of the substrate.

7. The method of claim 1, further comprising thinning the second side of the substrate to a thickness less than 30 micrometers.

8. The method of claim 1, further comprising aligning the substrate from a backside of the substrate.

9. A method of singulating a plurality of die comprised in a substrate, the method comprising:
    forming a plurality of die on a first side of a substrate;
    forming a seed layer over a second side of the substrate;
    using a shadow mask, applying a mask layer over the second side of the substrate;
    forming a backside metal layer over the second side of the substrate;
    removing the mask layer;
    flipping the substrate;
    removing substrate material in a die street; and
    removing seed layer material in the die street after removing the substrate material.

10. The method of claim 9, wherein the mask layer comprises a photoresist material.

11. The method of claim 9, wherein removing substrate material in the die street comprises plasma etching the substrate.

12. The method of claim 9, further comprising thinning the second side of the substrate to a thickness less than 30 micrometers.

13. The method of claim 9, further comprising aligning the substrate from a backside of the substrate.

14. A method of singulating a plurality of die comprised in a substrate, the method comprising:
- forming a plurality of die on a first side of a substrate;
- forming a seed layer over a second side of the substrate;
- using a shadow mask, applying a mask layer over the second side of the substrate;
- forming a backside metal layer over the second side of the substrate;
- removing the mask layer;
- flipping the substrate;
- etching the substrate from the first side of the substrate in a die street; and
- singulating the plurality of die through jet ablating the seed layer in the die street after etching the substrate.

15. The method of claim 14, wherein the mask layer comprises a photoresist material.

16. The method of claim 14, further comprising thinning the substrate.

17. The method of claim 14, wherein the backside metal layer is 10 micrometers thick.

18. The method of claim 14, wherein the mask layer comprises a resin.

* * * * *